(12) United States Patent
Ortler

(10) Patent No.: US 7,772,928 B2
(45) Date of Patent: Aug. 10, 2010

(54) ARRANGEMENT FOR PHASE SYNCHRONIZATION ACCORDING TO THE MASTER/SLAVE PRINCIPLE

(75) Inventor: Georg Ortler, Gessertshausen (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 106 days.

(21) Appl. No.: 12/159,843

(22) PCT Filed: Jan. 4, 2007

(86) PCT No.: PCT/EP2007/000042

§ 371 (c)(1),
(2), (4) Date: Jul. 15, 2008

(87) PCT Pub. No.: WO2007/124788

PCT Pub. Date: Nov. 8, 2007

(65) Prior Publication Data

US 2009/0096536 A1    Apr. 16, 2009

(30) Foreign Application Priority Data

Jan. 10, 2006   (DE)   .................. 10 2006 001 284
Jan. 26, 2006   (DE)   .................. 10 2006 003 839

(51) Int. Cl.
*G01R 23/00*   (2006.01)
*H03L 7/06*    (2006.01)
*H03L 7/07*    (2006.01)
*H03L 7/18*    (2006.01)

(52) U.S. Cl. .................. 331/2; 331/11; 331/14; 331/16; 331/44

(58) Field of Classification Search .................. 331/1 A, 331/2, 8, 10, 11, 14, 16–18, 25, 44, 49, 55; 327/146–150

See application file for complete search history.

(56) References Cited

U.S. PATENT DOCUMENTS 4,282,493 A  *  8/1981   Moreau .................. 331/2

(Continued)

FOREIGN PATENT DOCUMENTS

CA       22 72 658        6/1998

(Continued)

OTHER PUBLICATIONS

International Search Report for PCT/EP2007/000042 dated Apr. 12, 2007.

*Primary Examiner*—David Mis
(74) *Attorney, Agent, or Firm*—Marshall, Gerstein & Borun LLP

(57) ABSTRACT

An apparatus for the phase synchronization of several devices, wherein one device is the master device and the other devices are slave devices, with a phase synchronization unit for every device, each of which has: a first controlled oscillator for producing a master reference signal, a first phase detector which, in order to control the first oscillator, compares the phase of a first comparison signal derived from the master reference signal with the phase of a second comparison signal derived from an auxiliary reference signal if the device is itself the master device and a second phase detector which, in order to control the first oscillator, compares the phase of a third comparison signal derived from the master reference signal with the phase of a reference signal coming from the phase synchronization unit of the master device if the device is not itself the master device but a slave device.

12 Claims, 4 Drawing Sheets

U.S. PATENT DOCUMENTS 4,511,859 A     4/1985    Dombrowski
6,147,562 A    11/2000   Quirmbach
6,970,000 B2   11/2005   Evers et al.

FOREIGN PATENT DOCUMENTS

DE    102 46 700    4/2004
DE    103 31 092    2/2005
EP     0 941 580    9/1999

\* cited by examiner

ARRANGEMENT FOR PHASE SYNCHRONIZATION ACCORDING TO THE MASTER/SLAVE PRINCIPLE

BACKGROUND OF THE INVENTION

1. Field of the Invention

The invention relates to an arrangement for phase synchronization.

2. Related Technology

A generic arrangement for phase synchronization is known from DE 103 31 092 A1. With this arrangement for phase synchronization, several measuring devices, especially network analyzers, are combined to form a measuring system. The individual measuring devices are connected to one another via a connecting line in such a manner that the individual phase-locked loops (PLL) receive the same reference frequency. According to this design, there are no master or slave devices, but all the devices have equal entitlement. This control concept can provide entirely satisfactory results when connecting together only a few devices, for example, only two or three devices. However, if very many devices are to be connected together, this arrangement provides a relatively-long transient time, and relatively-long time phase fluctuations can occur.

DE 102 46 700 A1 discloses a vectorial network analyzer with controllable signal generators and controllable oscillators. However, this document contains no reference regarding how several such devices can be synchronized with one another.

SUMMARY OF THE INVENTION

The invention therefore provides an arrangement for phase synchronization, which functions reliably even when many devices are connected together and which has a short transient time.

The invention provides an arrangement for phase synchronization of the invention of several devices, wherein one device is the master device and the other devices are slave devices, with a phase-synchronization unit (30) for every device, each of which has: a first controlled oscillator (39) for generating a master-reference signal (REF), a first phase detector (33) which, in order to control the first oscillator (39), compares the phase of a first comparison signal (V1) derived from the master-reference signal (REF) with the phase of a second comparison signal (V2) derived from an auxiliary-reference signal (REF_IN) if the device itself is the master device, and a second phase detector (38) which, in order to control the first oscillator (39), compares the phase of a third comparison signal (V3) derived from the master-reference signal (REF) with the phase of a reference signal (CASC_REF) originating from the phase-synchronization unit (30) of the master device if the device itself is not the master device but a slave device.

The invention is based upon the concept of operating respectively one device as a master device and of subordinating the other measuring devices (slaves) to this master device. In this context, one phase-synchronization unit, which provides a controlled oscillator for generating a master-reference signal, is provided for each device. Moreover, a first phase detector is provided for controlling this oscillator according to the phase-locked loop (PLL) principle. However, this first phase detector is only used within the phase-locked loop if the device itself is the master device. In this case, the master-reference signal, optionally divided down in the divider, is compared with regard to its phase with an auxiliary-reference signal, which has also optionally being divided down. The master-reference signal is communicated to the other slave devices via a connecting line. These slave devices do not use the auxiliary-reference signal for the phase comparison in a second phase detector, but use this master-reference signal communicated from the master device.

This means that all of the phase-locked loops in all devices are synchronized to the same reference signal, which is specified by the master device. In the case of the prior art according to DE 103 31 092 A1, the phase-locked loops of the individual devices are only loosely connected via separating transformers, and all of the phase-locked loops settle relative to one another. By contrast, a substantially-shorter transient time is achieved by the concept according to the invention, wherein the master device impresses the reference signal, which must necessarily be used by the slave devices.

In this context, the first phase detector for synchronization with the internal master-reference signal and the second phase detector for synchronization with the external master-reference signal can be identical; that is to say, in physical terms, the same phase detector can be used when the system switches between the external master-reference signal and the internal master-reference signal. However, by preference, two constantly-steady phase detectors are provided, and, at the output of the phase detector for controlling the oscillator, a first switching element switches dependent upon whether the device itself is the master device or the slave device. The master-reference signal can be switched to the connecting line with the other devices via a second switching element if the device itself is the master device.

The signals to be compared in the phase detectors can be supplied to the phase detector either directly or via corresponding dividers, which divide the frequency by a specified division factor.

The phase-synchronization units can contain a second, similarly-structured arrangement for synchronizing the clock pulse for the analog/digital converters. It is important not only that the reference signals for the generators and local oscillators of the devices provide an accurate phase synchronization; the best possible phase synchronicity of the clock-pulse signals determining the sampling times for the analog/digital converters must preferably also be achieved. This ensures that the individual devices sample the sampling values at exactly identical times.

Two separate phase detectors are preferably provided even for synchronizing the clock-pulse signal for the analog/digital converters. In this context, a first phase detector is used if the device itself is the master device, thereby synchronizing to the output signal of the internal clock-pulse generator. The other phase detector is used if the device itself is a slave device, thereby synchronizing to the clock-pulse signal supplied externally by the master device. However, within the framework of the invention, it is also possible for the third and fourth phase detectors to be represented physically for these two tasks by one, common phase detector, and for one of the comparison signals to be switched over accordingly.

BRIEF DESCRIPTION OF THE DRAWINGS

An exemplary embodiment of the invention is described below with reference to the drawings. The drawings are as follows.

DETAILED DESCRIPTION

Figure 1:
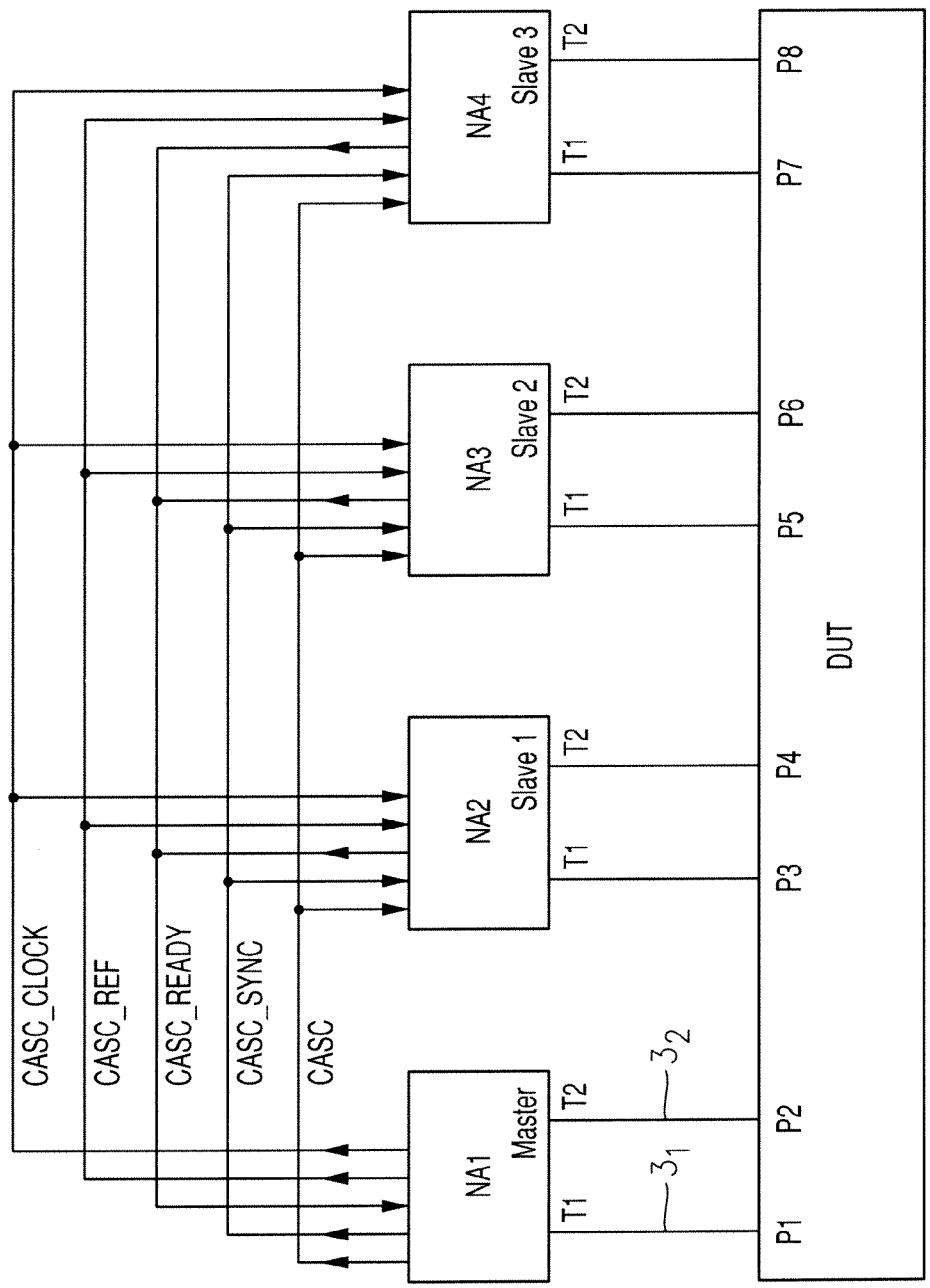
FIG. 1 shows a block-circuit diagram of the arrangement according to the invention for phase synchronization.

FIG. 1 shows an overview block-circuit diagram of the arrangement according to the invention for phase synchronization. Several measuring devices, for example, network analyzers NA1, NA2, NA3, NA4, but also, for example, spectrum analyzers, are to be connected together to form a combined measuring device. This may be necessary, for example, because the individual measuring devices, especially network analyzers, each have only two test ports T1 and T2, but the device under test (DUT) provides several input and output ports P1, P2, P3, P4, P5, P6, P7 and P8, which are to be measured simultaneously. In this context, an accurate measurement of the phase position of the measurement signals relative to the phase position of the excitation signals must be achieved. For instance, the device under test DUT could be excited at its ports P1 and P2 by a first network analyzer NA1 with a differential signal (differential mode), wherein the signals to be generated in the differential mode at the ports T1 and T2 of the network analyzer NA1 must have an exact phase difference of 180°. The other ports P3 to P8 can be, for example, the output ports of the device under test, wherein the exact phase position relative to the excitation signal must be measured at every port P3 to P8.

Figure 3:
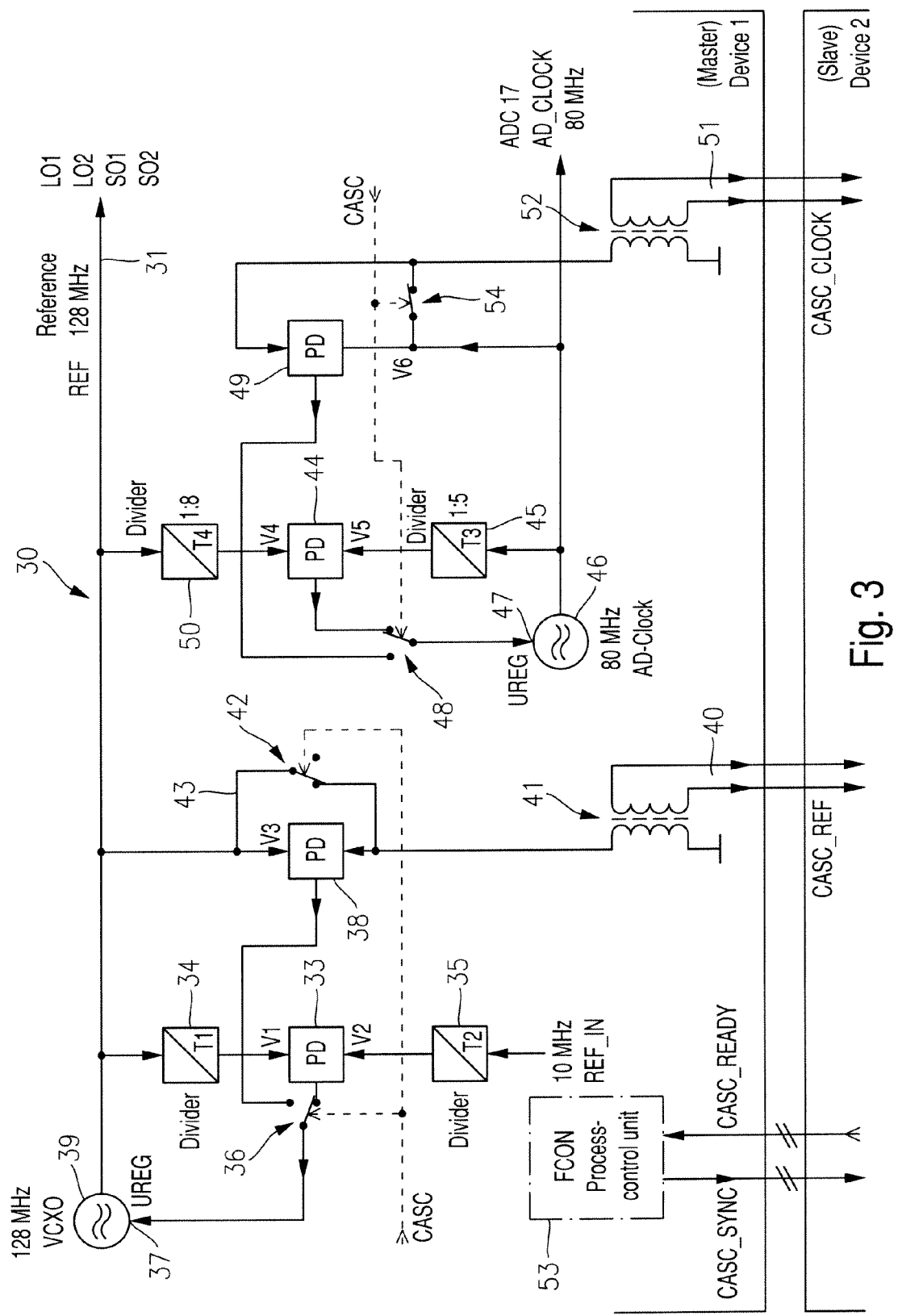
FIG. 3 shows an exemplary embodiment of a phase-synchronization unit for synchronization of a reference frequency and a clock-pulse signal.

In order to achieve this, it is proposed according to the invention that one of the measuring devices, in the example shown in FIG. 1, the measuring device NA1, should be operated as a master device and the other measuring devices, in the example shown in FIG. 1, the measuring devices NA2, NA3, NA4, should be operated as slave devices subordinate to the master device NA1. For this purpose, the master device NA1 first communicates to the other devices NA2 to NA4 via the signal CASC, that it wishes to set up a combined connection (cascading) and that it will be the master device in this measurement task. Following this, the switching elements in the individual measuring devices, which will be explained below with reference to FIG. 3, are switched into the corresponding switching position. With the query CASC_SYNC, the master device NA1 asks the slave devices NA2 to NA4 whether the switching process is complete. The devices NA2 to NA4 confirm this via the signal CASC-READY. In this configuration, the master device NA1 supplies the slave devices NA2 to NA4 with a reference signal CASC_REF and, in the illustrated, preferred exemplary embodiment, additionally with a clock-pulse signal CASC_CLOCK.

Figure 2:
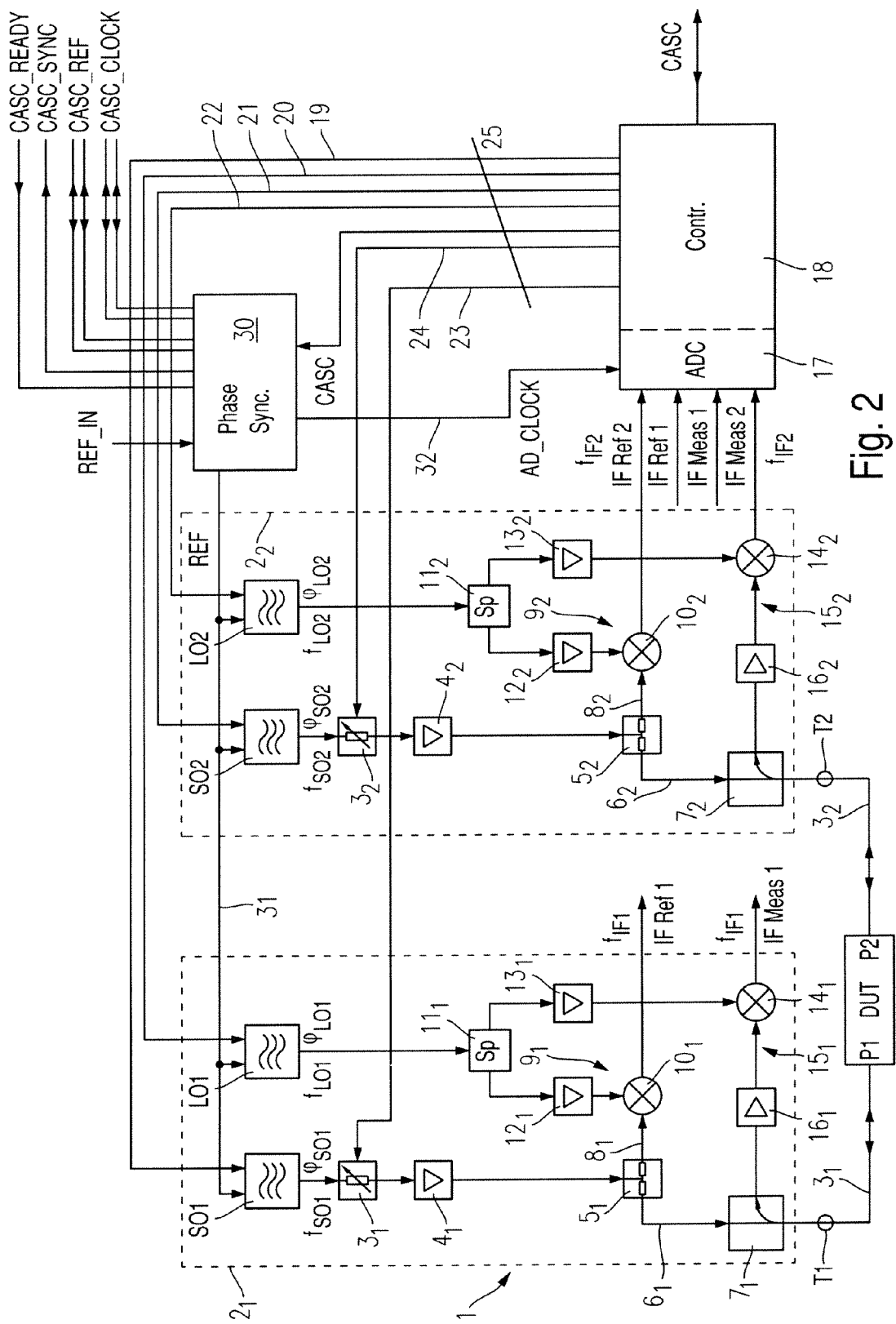
FIG. 2 shows an exemplary embodiment of a vectorial network analyzer with the phase synchronization according to the invention.

By way of explanation regarding why the reference signal CASC_REF and the reference clock-pulse signal CASC_CLOCK are required, FIG. 2 provides an example of the internal structure of a network analyzer. The network analyzers NA1 to NA4 illustrated in FIG. 1 can be structured according to the block-circuit diagram shown in FIG. 2.

FIG. 2 shows an exemplary embodiment of one of the measuring devices NA1-NA4, in which the phase synchronization according to the invention is used. In the illustrated exemplary embodiment, the measuring devices are vectorial network analyzers. However, the measuring devices are not restricted to network analyzers. The exemplary embodiment presented is the 2-port network analyzer NA1. In this context, it must be emphasized that the concept according to the invention with vectorial network analyzers is not restricted to 2-port network analyzers, but is also appropriate for multi-port network analyzers with more than two test ports.

In the exemplary embodiment presented, a separate excitation/reception unit $2_1$ and respectively $2_2$ is provided at each port T1, T2 of the network analyzer NA1. Each excitation/reception unit $2_1$ and respectively $2_2$ provides a signal generator SO1 and respectively SO2, with which the device under test DUT can be supplied with an excitation signal. Either only one of the two signal generators SO1 or respectively SO2 may be active, or both signal generators SO1 and SO2 can each transmit an excitation signal.

In the exemplary application presented in FIG. 1, the device under test is an 8-port device. Each of the first two ports P1 and P2 of the device under test DUT is connected via a measuring line $3_1$ and respectively $3_2$ to one of the two ports T1 and T2 of the first network analyzer NA1.

The signal generators SO1 and SO2 are each connected via a variable attenuation element $3_1$ and respectively $3_2$ and respectively an amplifier $4_1$ and $4_2$ to a signal splitter $5_1$ and $5_2$. A signal branch $6_1$ and respectively $6_2$ is connected respectively via a bridge (e.g. directional coupler) $7_1$ and $7_2$ to the associated port T1 and T2. The other branch $8_1$ and respectively $8_2$ is connected to a mixer $10_1$ and $10_2$ of a first receiver device $9_1$ and $9_2$ of the respective excitation/reception unit $2_1$ and respectively $2_2$. The first receiver device $9_1$ and $9_2$ therefore receives the excitation signal when the associated signal generator SO1 and SO2 is active. Furthermore, an oscillator signal, which is generated by an internal oscillator LO1 and LO2 of the respective excitation/reception unit $2_1$ and $2_2$, and supplied to the mixer $10_1$ and $10_2$ via a signal splitter $11_1$ and $11_2$ and respectively an amplifier $12_1$ and $12_2$, is supplied to the mixer $10_1$ and $10_2$.

Via the other signal branch of the signal splitter $11_1$ and $1_{12}$ and a corresponding amplifier $13_1$ and $13_2$, the same oscillator LO1 and LO2 supplies a mixer $14_1$ and $14_2$ of a second receiver device $15_1$ and $15_2$ of the respective excitation/reception unit $2_1$ and $2_2$. The mixer $14_1$ and $14_2$ is connected to the associated port T1 and T2 via an isolation amplifier $16_1$ and $16_2$ and the bridge $7_1$ and $7_2$. Accordingly, the second receiver device $15_1$ receives the signal received by the associated port T1, which is reflected from the device under test to port T1 or transmitted through the device under test DUT from port T1 to port T2. Accordingly, the second receiver device $15_2$ of the excitation/reception unit 22 receives the signal reflected from the device under test DUT to port T2 or transmitted through the device under test DUT from port T1 to port T2. The mixers $10_1$ and $14_1$ of the first excitation/reception unit 21 convert the signal received into a first intermediate-frequency position with the intermediate frequency $f_{IF1}$, while the mixers $10_2$ and $14_2$ of the second excitation/reception unit $2_2$ convert the received signal into a second intermediate-frequency position with the intermediate frequency $f_{IF2}$. In this context, the intermediate frequencies $f_{IF1}$ and $f_{IF2}$ are not necessarily identical.

The intermediate-frequency reference signal IF Ref 1 and respectively IF Ref 2 generated by the mixers $10_1$ and $10_2$ and the intermediate-frequency measurement signal IF Meas 1 and respectively IF Meas 2 generated by the mixers $14_1$ and $14_2$ are supplied to an analog/digital converter 17, which is connected to a signal evaluation and control unit 18, where an evaluation of the reference signals and the measurement signals is carried out. The signal evaluation and control unit 18 also controls the signal generators SO1 and SO2 and the oscillators LO1 and LO2 via control lines 19, 20, 21 and 22 in such a manner that these generate a signal with a predetermined frequency $f_{SO1}$, $f_{LO1}$, $f_{SO2}$ and $f_{LO2}$ and with a predetermined phase $\phi_{SO1}$, $\phi_{LO1}$, $\phi_{SO2}$ and $\phi_{LO2}$.

The evaluation and control unit 18 is connected via further control lines 23 and 24 to the adjustable attenuation elements $3_1$ and $3_2$, so that the signal amplitude of the excitation signal generated by the signal generators SO1 and SO2 can be controlled. Since the actual amplitude of the excitation signal is registered via the intermediate-frequency reference signals IF Ref 1 and IF Ref 2, a phase-locked loop for the accurate control of the excitation amplitude can be formed in this manner.

The control lines 19 to 23 can be combined to form a bus system 25, in particular, a LAN bus system. Differences in delay time, for example, in the measurement lines $3_1$ and $3_2$ can be compensated through different settings of the phases, $\phi_{LO1}$, $\phi_{LO2}$ or respectively $\phi_{SO1}$, $\phi_{SO2}$.

It must be reiterated that the further development according to the invention relates not only to network analyzers but is also relevant for other measurement equipment.

According to the embodiment of the invention, the network analyzer presented in FIG. 2 has a phase-synchronization unit 30, which receives or respectively transmits the signals CASC_READY, CASC_SYNC, CASC_REF and CASC_CLOCK as described with reference to FIG. 1. The control unit 18 determines whether the respective network analyzer is the master device or the slave device. For example, the person operating the system can enter in the respective network analyzer that this network analyzer NA1 is to be the master device. This network analyzer NA1 then transmits the signal CASC to the other network analyzers NA2-NA4, which then register that they are slave network analyzers in the future measurement task. Moreover, the CASC signal is transmitted to the phase-synchronization unit 30, where switching elements, which will be described below with reference to FIG. 3, are activated in response.

The phase-synchronization unit 30 is connected to the signal generators SO1 and SO2 and to the local oscillators LO1 and LO2 via a connecting line 31 and presents the latter with a master-reference signal REF. The phase-synchronization unit 30 is connected to the analog/digital converter 17 via a connecting line 32 and communicates the clock-pulse signal AD_CLOCK to the latter in order to specify the sampling time. The auxiliary-reference signal REF_IN required to generate the master-reference signal REF can either be supplied externally or generated within the network analyzer.

In the form of a block-circuit diagram, FIG. 3 shows an exemplary embodiment of the structure of the phase-synchronization unit 30. A controllable oscillator 39 generates the master-reference signal REF. A first phase detector 33 receives a first comparison signal V2. In the exemplary embodiment presented, the first comparison signal V1 is derived from the master-reference signal REF in such a manner that the frequency of the master-reference signal is divided in a first divider 34 by a first division factor T1. The second comparison signal V2, of which the phase is compared with the phase of the first comparison signal V1, is derived from the auxiliary-reference signal REF_IN. For this purpose, the frequency of the auxiliary-reference signal REF_IN in the exemplary embodiment presented is divided in a second divider 35 by a second division factor T2. A control signal, which provides a measure for the phase deviation between the two comparison signals V1 and V2, is therefore provided at the output of the first phase detector 33. This can be supplied via a first switching element 36 as a control signal UREG to a control input 34 of the oscillator 39.

The switching position shown in FIG. 3 corresponds to the situation that the device NA1 allocated to the phase-synchronization unit 30 is the master device. In this situation, the first switching element 36 connects the output of the first phase detector 33 to the control input 37 of the controlled oscillator 39. However, if the associated device is a slave, the first switching element 36 is in the upper switching position and connects the output of a second phase detector 38 to the control input 37 of the oscillator 39.

The first comparison signal V3, which is supplied to the second phase detector 38 is the master-reference signal REF. The other comparison signal is the master-reference signal of the master device, which is supplied in the exemplary embodiment via a two-wire connecting line 40 and a transformer 41 to the other input of the second phase detector 38. A second switching element 42 closes the connecting line 43 only if the associated device is the master device. If the device is a slave device, the line 43 is left open; in this case, a phase comparison is implemented between the master-reference signal REF and the reference signal CASC_REF supplied by the master device.

Accordingly, in the switching position shown in FIG. 3 for the master operating mode, a phase-locked loop is provided from the output of the oscillator 39 via the divider 34 and the phase detector 33 to the control input 37 of the oscillator 39, wherein the phase comparison is implemented with the auxiliary-reference signal REF_IN. By contrast, in the slave operating mode, a phase-locked loop is provided from the output of the oscillator 39 via the phase detector 38 to the control input 37 of the oscillator 39, wherein the phase comparison is then implemented with the master-reference signal REF of the master device. This ensures that the phase-locked loops of all devices operate synchronously with one another and the oscillators 39 of all devices generate phase-synchronous reference signals REF, which are supplied to the respective signal generators SO1, SO2 and local oscillators LO1, LO2 of the respective devices, which then also operate synchronously with one another, as will be described in greater detail below with reference to FIG. 4.

In one preferred exemplary embodiment, a further object of the phase-synchronization unit 30 is to ensure the synchronicity of the clock-pulse signals of the analog/digital converters. For this purpose, a third phase detector 44 is provided, which compares the phase of a fourth comparison signal V4 with the phase of a fifth comparison signal V5. The fifth comparison signal V5 is derived via a third divider 45 from the clock-pulse signal AD_CLOCK, wherein the third divider 45 divides the frequency of the clock-pulse signal AD_CLOCK by a third division factor T3. The fourth comparison signal V4 is derived via a fourth divider 50 from the master-reference signal REF, wherein the fourth divider 50 divides the frequency of the master-reference signal REF by the division factor T4. The clock-pulse signal AD_CLOCK for the analog/digital converters 17 is generated by means of a second oscillator 46, of which the control input 47 can be connected via a third switching element 48 to the output of the third phase detector 44. This connection is switched via the signal CASC only if the device itself is the master device. If the device is a slave device, the third switching element 48 connects the control input 47 of the second oscillator 46 to the output of a fourth phase detector 49.

However, if the device is a slave device, the third switching element 48 connects the control input 47 of the second oscillator 46 to the output of a fourth phase detector 49. One of the comparison signals, which are supplied to the fourth phase detector 49, is the clock-pulse signal AD_CLOCK generated by the second generator 46. The other comparison signal is the clock-pulse signal CASC_CLOCK, which is supplied from the master device via the two-wire connecting line 51 and the transformer 52. A fourth switching element 54 is closed only if the device itself is the master device. This ensures that the clock-pulse signal AD_CLOCK generated by this master device is transmitted via the two-wire line 51 as a clock pulse signal CASC_CLOCK to the slave devices and used there for the synchronization of the clock-pulse signals. Accordingly, all of the clock-pulse signals AD_CLOCK generated by the respective phase-synchronization unit 30 in each of the devices are synchronized with one another.

Here also, a first phase-locked loop is created through the second oscillator 46, the third divider 45 and the third phase detector 44 if the device itself is the master device, wherein this phase-locked loop synchronizes to the master-reference signal REF. Alternatively, a second phase-locked loop is created through the generator 46 and the fourth phase detector 49 if the device itself is the slave device, in this case synchronizing to the external clock-pulse signal CASC_CLOCK.

Furthermore, a process-control unit 53 is preferably also provided. The process-control unit 53 of the master device transmits the command CASC_SYNC to all slave devices, which then activate the switching elements 36, 42, 48 and 54. The completion of switching is confirmed by the signal CASC_READY to the master device.

Figure 4:
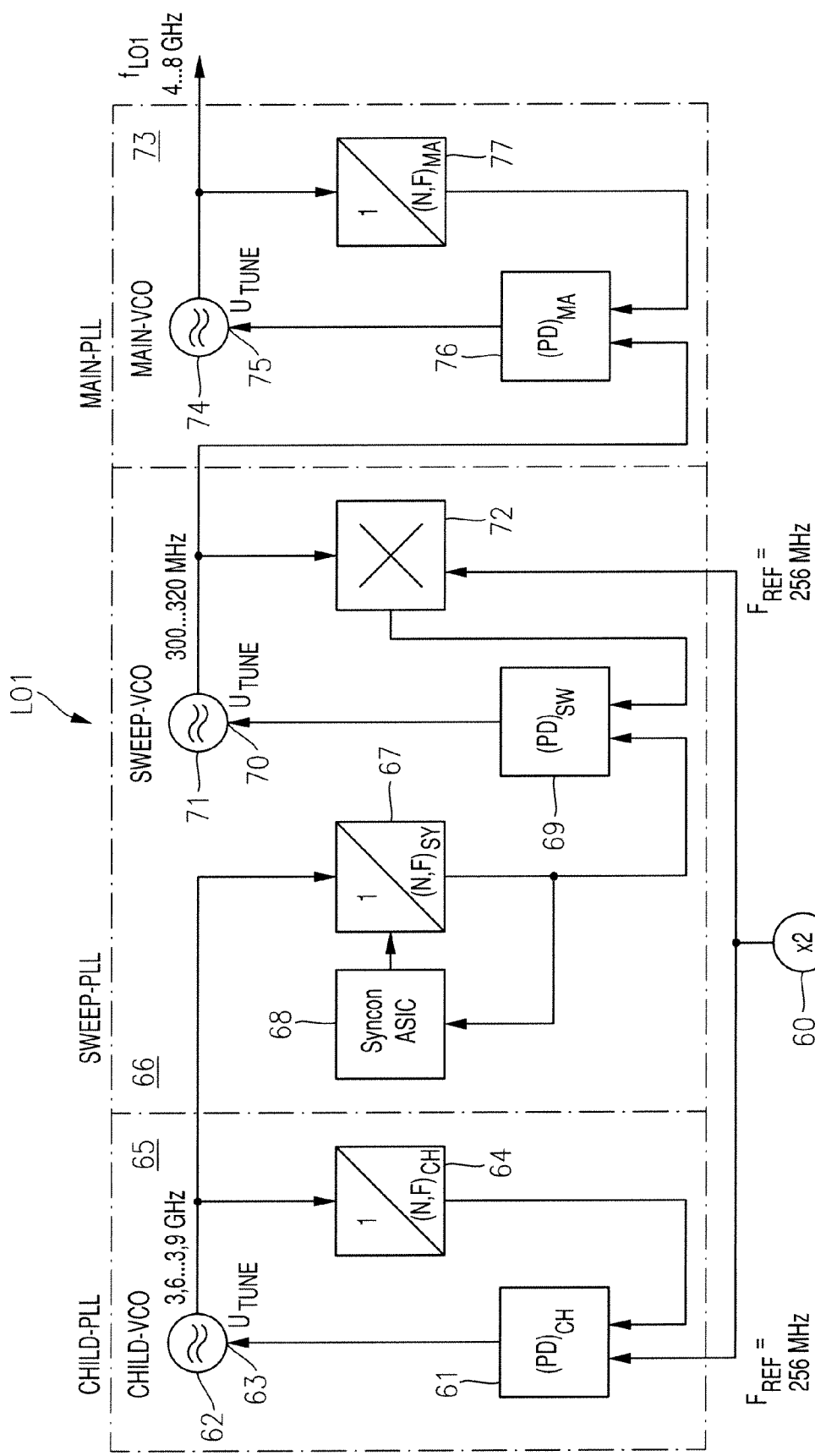
FIG. 4 shows an exemplary embodiment of a signal generator, which uses the phase synchronization according to the invention.

FIG. 4 shows one possible realization of one of the local oscillators LO1. Within the framework of the invention, any other realization is also possible. FIG. 4 is intended only to visualize one possible use of the master-reference signal REF.

The master-reference signal REF is transmitted by the phase-synchronization unit 30 to the local oscillator LO1 via the connecting line 31. In the local oscillator LO1 in the exemplary embodiment, the frequency of the master-reference signal REF is first doubled in a frequency doubler 60 and supplied within the local oscillator LO1 to a first comparison input of a first phase detector 61. The output of the phase detector 61 is connected to the control input 63 of a first oscillator 62. The output of the first oscillator 62 is connected via a first fractional divider 64 to the second comparison input of the first phase detector 61. Consequently, the first oscillator 62 with the divider 64 and the first phase detector 61 forms a first phase-locked loop, which is synchronized with the master-reference signal REF. This first phase-locked loop in the section 65 is also referred to as a Child_PLL.

The adjoining section 66 is referred to as the Sweep_PLL. A second divider 67, which is connected to the output of the first oscillator 62, is provided here. A synchronization component 68 ensures the selection of the broken-rational division factor $(N,F)_{SY}$. The output of the second divider 67 is connected to a first comparison input of a second phase detector 69, of which the output is once again connected to the control input 70 of a second oscillator 71. The output of the second oscillator 71 is connected to a first input of a mixer 72. A second input of the mixer 72 receives the master-reference signal REF doubled by the frequency doubler 60. The output of the mixer 72 is connected to the second comparison input of the second phase detector 69. In this manner, a second phase-locked loop, which is also synchronized via the master-reference signal REF, is formed by the second oscillator 71, the mixer 72 and the phase detector 69.

A third oscillator 74, of which the control input 75 is connected to a third phase detector 76, is provided in a third section 73 referred to as the MAIN_PLL. A first comparison input of the third phase detector 76 is connected to the output of the second oscillator 71, while a second comparison input of the third phase detector 76 is connected via a third divider 77 to the output of the third oscillator 74. The local oscillator signal with the frequency $f_{LO1}$ is provided at the output of the third oscillator 74, which is also referred to as the main oscillator. The frequency $f_{LO1}$ in this context can be tuned over one octave, in the exemplary embodiment from 4 GHz to 8 GHz.

The phase-synchronization unit 30 according to the invention provides a synchronization of the signal generators SO and the local oscillators LO in each of the interconnected devices. At the same time, a synchronization of the sampling rates of the analog/digital converters 17 is achieved. Shorter control times or respectively transient times are achieved because of the clear subordination of the slave devices relative to the one master device.

The invention is not restricted to the exemplary embodiment presented. In particular, not only network analyzers, but also other measuring devices, such as spectrum analyzers or oscilloscopes, can be used as measuring devices. With regard to network analyzers, alternative exemplary embodiments especially with only one local oscillator LO1 or respectively LO2 for two or more ports or only one signal generator SO1 or respectively SO2, which can be switched between two or more ports of the network analyzer, can also be provided. Moreover, the local oscillators LO can be designed differently from those presented in FIG. 4.

The invention claimed is:

1. Arrangement for the phase synchronization of several devices, wherein one device is a master device and the other devices are slave devices, with a phase-synchronization unit for every device, each of which phase-synchronization unit comprises:

a first controlled oscillator for generating a master-reference signal, a second controlled oscillator for generating a clock-pulse signal, a first phase detector which, in order to control the first oscillator, compares the phase of a first comparison signal derived from the master-reference signal with the phase of a second comparison signal derived from an auxiliary-reference signal if the device itself is the master device, a second phase detector which, in order to control the first oscillator, compares the phase of a third comparison signal derived from the master-reference signal with the phase of a reference signal originating from the phase-synchronization unit of the master device if the device itself is not the master device but a slave device, and a third phase detector, which, in order to control the second oscillator, compares the phase of a fourth comparison signal derived from the master-reference signal with the phase of a fifth comparison signal derived from the clock-pulse signal if the device itself is the master device.

2. Arrangement for phase synchronization according to claim 1, wherein every phase-synchronization unit comprises a switching element, which switches a control input of the first oscillator between an output of the first phase detector and an output of the second phase detector dependent upon whether the respective device is the master device or a slave device.

3. Arrangement for phase synchronization according to claim 1, wherein every phase-synchronization unit comprises a switching element, which supplies the master-reference signal to the phase-synchronization units of the slave devices if the device itself is the master device.

4. Arrangement for phase synchronization according to claim 1, wherein every phase-synchronization unit comprises a divider, which divides the frequency of the master-reference signal by a division factor in order to generate the first comparison signal, which is supplied to the first phase detector.

5. Arrangement for phase synchronization according to claim 1, wherein every phase-synchronization unit provides a divider, which divides the frequency of the auxiliary-reference signal by a division factor in order to generate the second comparison signal, which is supplied to the first phase detector.

6. Arrangement for phase synchronization according to claim 1, wherein the master-reference signal is supplied directly to the second phase detector.

7. Arrangement for phase synchronization according to claim 1, wherein every phase-synchronization unit also comprises:
   a fourth phase detector, which, in order to control the second oscillator, compares the phase of a sixth comparison signal derived from the clock-pulse signal with the phase of a reference clock-pulse signal, which is transferred from the phase-synchronization unit of the master device, if the device itself is not the master device but a slave device.

8. Arrangement for phase synchronization according to claim 7,
   wherein every phase-synchronization unit comprises a switching element, which switches a control input of the second oscillator between an output of the third phase detector and an output of the fourth phase detector dependent upon whether the device itself is the master device or a slave device.

9. Arrangement for phase synchronization according to claim 7, wherein every phase-synchronization unit comprises a switching element, which supplies the clock-pulse signal to the phase-synchronization units of the slave devices, if the device itself is the master device.

10. Arrangement for phase synchronization according to claim 9, wherein every phase-synchronization unit comprises a first divider, which divides the frequency of the master-reference signal by a first division factor in order to generate the fourth comparison signal, which is supplied to the third phase detector.

11. Arrangement for phase synchronization according to claim 10, wherein every phase-synchronization unit comprises a second divider, which divides the frequency of the clock-pulse signal by a second division factor in order to generate the fifth comparison signal, which is supplied to the third phase detector.

12. Arrangement for phase synchronization according to claim 7, wherein the clock-pulse signal is supplied directly to the fourth phase detector.

* * * * *